(12) United States Patent
Hogan et al.

(10) Patent No.: US 8,536,025 B2
(45) Date of Patent: Sep. 17, 2013

(54) RESIZED WAFER WITH A NEGATIVE PHOTORESIST RING AND DESIGN STRUCTURES THEREOF

(75) Inventors: Dennis P. Hogan, Jericho, VT (US); Gregory S. Jankowski, Milton, VT (US); Robert K. Leidy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 13/316,978

(22) Filed: Dec. 12, 2011

(65) Prior Publication Data

US 2013/0147056 A1   Jun. 13, 2013

(51) Int. Cl.
*H01L 21/46*   (2006.01)
*H01L 21/301*   (2006.01)

(52) U.S. Cl.
USPC ............ 438/463; 257/E21.214; 257/E21.237; 257/E21.238; 257/E21.483; 257/E21.596; 438/460

(58) Field of Classification Search
USPC ................... 257/E21.214, E21.237, E21.238, 257/E21.483, E21.596; 438/460, 463
See application file for complete search history.

(56) References Cited

U.S. PATENT DOCUMENTS

| 6,004,405 | A * | 12/1999 | Oishi et al. ................. 148/33.2 |
| 6,797,625 | B2 | 9/2004 | Kim et al. |
| 6,927,172 | B2 | 8/2005 | Bergner et al. |
| 6,960,532 | B2 | 11/2005 | Chen et al. |
| 7,173,083 | B2 | 2/2007 | Scheerder et al. |
| 7,208,326 | B2 | 4/2007 | Rennie et al. |
| 7,465,977 | B2 | 12/2008 | Landsberger et al. |
| 7,772,090 | B2 * | 8/2010 | Starkston et al. ............. 438/462 |
| 7,833,909 | B2 | 11/2010 | Komuro |
| 7,911,036 | B2 * | 3/2011 | Bradl et al. .................... 257/623 |
| 2001/0038153 | A1 * | 11/2001 | Sakaguchi .................... 257/797 |
| 2003/0217693 | A1 | 11/2003 | Rattner et al. |
| 2004/0188789 | A1 * | 9/2004 | Koyama et al. ............... 257/432 |
| 2006/0087007 | A1 | 4/2006 | Arai et al. |
| 2009/0191690 | A1 * | 7/2009 | Boyle et al. ................... 438/462 |
| 2009/0297986 | A1 | 12/2009 | Moritoki |
| 2011/0233705 | A1 * | 9/2011 | Lake ............................. 257/432 |
| 2012/0009763 | A1 * | 1/2012 | Jarry ............................. 438/463 |

OTHER PUBLICATIONS

F. Ghahghahi et al. "Preparation of Custom Gate Array Silicon Wafers to Handle Specific Wafer Size in Metallization Process", IEEE/CHMT '89 IEMT Symposium, pp. 336-343.

* cited by examiner

*Primary Examiner* — Asok K Sarkar
(74) *Attorney, Agent, or Firm* — Michael LeStrange; Roberts Mlotkowski Safran & Cole, P.C.

(57) ABSTRACT

A resized wafer using a negative photoresist ring, methods of manufacture and design structures thereof are disclosed. The method includes forming a ring within a radius of a wafer. The method also includes patterning a photoresist formed on the wafer, by exposing the photoresist to energy. Additionally, the method includes forming troughs in a substrate of the wafer based on the patterning of the photoresist, wherein the ring blocks formation of the troughs underneath the ring. The method also includes filling the troughs with a metal and resizing the wafer at an area of the ring.

17 Claims, 5 Drawing Sheets

RESIZED WAFER WITH A NEGATIVE PHOTORESIST RING AND DESIGN STRUCTURES THEREOF

FIELD OF THE INVENTION

The invention relates to semiconductor structures and, more particularly, a resized wafer using a negative photoresist ring, methods of manufacture and design structures thereof.

BACKGROUND

A wafer is a thin slice of semiconductor material, such as a silicon crystal, used in the fabrication of integrated circuits and other microelectronics and micro devices. The wafer serves as the substrate for integrated circuits built in and over the wafer. In order to fabricate the integrated circuits, the wafer undergoes many micro fabrication process steps such as doping or ion implantation, etching, deposition of various materials, and photolithographic patterning. Once the integrated circuits are formed, individual microcircuits are separated (diced) and packaged to form a product.

In many instances, though, packaging includes integrated circuits of different technologies. These different technologies are formed on different wafers, including different sized wafers. In some complex processes, for example, integrated circuits can be formed on a 200 mm wafer; whereas, in other complex processes, for example, integrated circuits require formation on a 150 mm wafer. In certain technology fabrication processes, though, it may be necessary to resize the 200 mm wafer to a 150 mm wafer for further processing. This is usually performed by a laser; however, such resizing is known to expose wiring layers at an edge of the resized wafer, resulting in complications, and further processing that is both time consuming and prone to low yields.

Accordingly, there exists a need in the art to overcome the deficiencies and limitations described hereinabove.

SUMMARY

In an aspect of the invention, a method comprises forming a ring within a radius of a wafer. The method also comprises patterning a photoresist formed on the wafer, by exposing the photoresist to energy. The method further comprises forming troughs in a substrate of the wafer based on the patterning of the photoresist, wherein the ring blocks formation of the troughs underneath the ring. The method further comprises filling the troughs with a metal and resizing the wafer at an area of the ring.

In an aspect of the invention, a method comprises forming a negative photoresist ring within a radius of a wafer. The method further comprises patterning a photoresist formed on the wafer, by exposing the photoresist to energy. The method further comprises forming troughs in a substrate of the wafer based on the patterning of the photoresist, wherein the negative photoresist ring blocks formation of the troughs underneath the negative photoresist ring. The method further comprises filling the troughs with a metal. The method further comprises removing the negative photoresist ring and excess metal using a CMP process, and resizing the wafer at an area of the ring.

In an aspect of the invention, a structure comprises a resized wafer having a beveled edge, which is devoid of a metal wiring layer and troughs. The structure further comprises troughs formed in an interior portion of the resized wafer, and a metal wiring layer formed within the troughs.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the resized wafer with a negative photoresist ring, which comprises the structures of the present invention. In still further embodiments, a method in a computer-aided design system is provided for generating a functional design model of the resized wafer with a negative photoresist ring. The method comprises generating a functional representation of the structural elements of the resized wafer with a negative photoresist ring.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and, more particularly, a resized wafer using a photoresist ring, methods of manufacture and design structures thereof. In embodiments, a wafer is resized by implementing a negative photoresist ring formed about a portion of the wafer. The negative photoresist can be formed, for example, using a wafer edge exposure tool. In embodiments, the negative photoresist ring will be formed within a radius of the original wafer, and is representative of an edge of a resized wafer. In embodiments, the photoresist ring prevents a wiring layer from being formed on such edge during metal formation on the remaining portions of the wafer. More specifically, during metal wiring formation, the negative photoresist ring will prevent wiring formation at a certain wafer level and at a certain radial location. Instead, during metal deposition, a metal wiring will form on the negative photoresist ring, which can be removed during later processing steps. In this way, when resizing the wafer, there will be no metal, e.g., copper (Cu), contamination on the edge of the resized wafer.

Advantageously, the negative photoresist will prevent troughs from being etched at the edge of a resized wafer.

Thus, metal wiring layers will be prevented from forming at the edge of the resized wafer. In this way, the exposed negative photoresist ring will seal the edge of a resized wafer so that metal, e.g., copper (Cu), cannot contaminate such edge. Instead, due to the use of the negative photoresist, any metal formed on the negative photoresist ring can be removed using a CMP process, as is known to those of skill in the art. Additionally, the present invention provides for increased chip density on the wafer.

Figure 1:
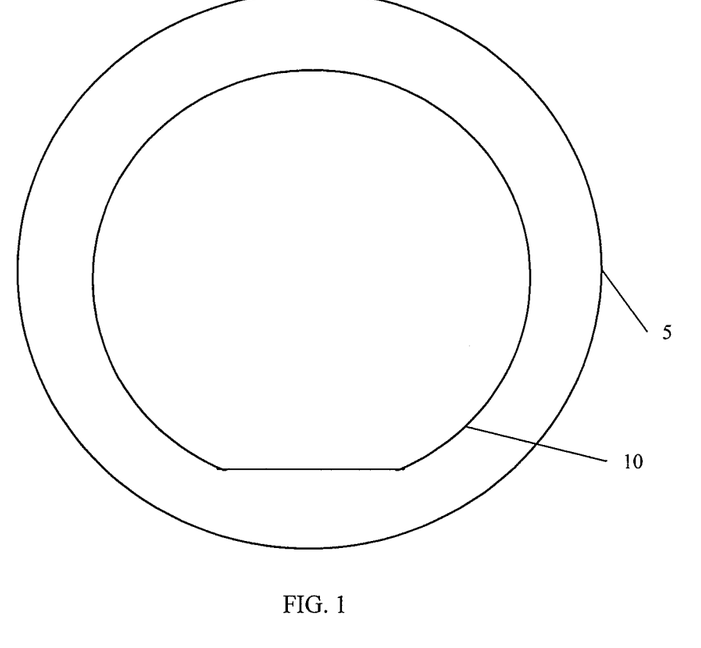
FIG. 1 shows a wafer according to aspects of the present invention.

FIG. 1 shows a wafer according to aspects of the present invention. More specifically, FIG. 1 shows a wafer 5 marked with a resized edge 10. In embodiments, the wafer can be a 200 mm wafer with a resized edge of 150 mm; although other dimensions are also contemplated in the present invention. Thus, in embodiments of the present invention, the wafer 5 is resized to form a wafer with the edge 10. In embodiments, the wafer 5 can be cut using a laser to form the resized wafer with the edge 10. In embodiments, the resized wafer with the edge 10 can have beveled edges, as discussed in more detail below.

Figure 2:
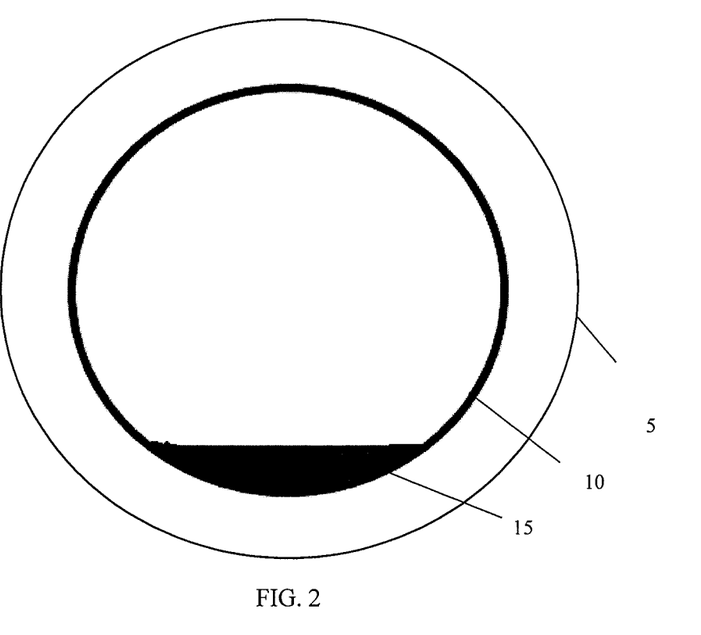
FIG. 2 shows a wafer with a negative photoresist ring according to aspects of the present invention.

FIG. 2 shows a wafer 5 with a negative photoresist ring 15 formed on the edge 10 (e.g., within a radius of the wafer 5). In embodiments, the negative photoresist ring 15 is formed prior to forming a wiring layer on the wafer 5. In embodiments, the negative photoresist ring 15 is printed on the edge 10, and then exposed using a wafer edge exposure (WEE) tool to block subsequent damascene etch in the region of the negative photoresist ring 15.

In embodiments, the negative photoresist ring 15 is deposited using conventional deposition processes, and then exposed to an ultra-violet (UV) light or other energy source, e.g., mercury lamps, that are optically aligned through the use of precision bases, to deliver an optimum dose of UV radiation on the negative photoresist ring 15. As should be understood by those of skill in the art, the exposed negative photoresist ring 15 will harden and become a cross-linked polymer. As a result, in subsequent processes, a developer will not be able to remove the exposed negative photoresist ring 15. More specifically, exposure to UV light causes the negative photoresist ring 15 to become polymerized and difficult to dissolve during subsequent etching processes. In this way, the negative photoresist remains on the surface of the wafer 5, at the edge 10, during subsequent processes, i.e., the negative photoresist is an additive material.

Figure 3:
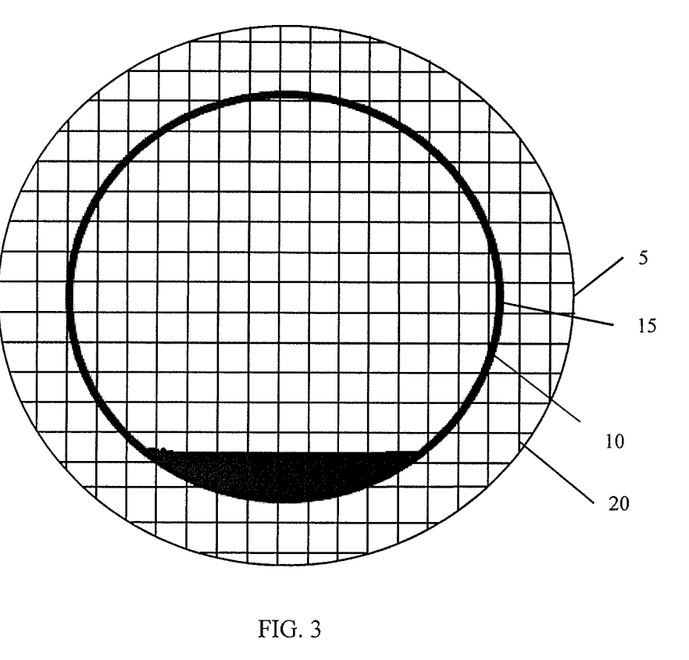
FIG. 3 shows a wafer with a negative photoresist ring and a photoresist pattern according to aspects of the present invention.

As shown in FIG. 3, after the negative photoresist ring 15 is formed, a pattern 20 is formed on the wafer 5 by using conventional photolithographic processes. More specifically, in embodiments, the pattern 20 is formed by depositing a photoresist on the wafer 5 and exposing it to energy to form the pattern 20. It should be understood that the pattern 20 shown in FIG. 3 is an exemplary pattern, which is provided for illustrative purposes only. As such, one of skill in the art should recognize that other patterns are also contemplated by the present invention. As should also be recognized by those of skill in the art, the pattern 20 will overlap the negative photoresist ring 15; however, the negative photoresist ring 15 will prevent subsequent etching from occurring in the underlying substrate layer.

After the pattern 20 is formed, the wafer 5 undergoes a conventional etching process to form troughs. The pattern for the troughs will correspond to the pattern 20. In embodiments, the troughs are formed in the underlying substrate, but not underneath the negative photoresist ring 15, as it is hardened and cannot be etched. In embodiments, a negative photoresist can be used to form both the negative photoresist ring 15 and the pattern 20 for the troughs. In alternate embodiments, a positive photoresist is used to form the pattern 20 for the troughs.

After the photoresist is exposed and the troughs are etched, any excess photoresist is removed and the wafer is then electroplated to form one or more copper (Cu) wirings in the troughs; although it should be understood that other metal wiring is contemplated in the present invention. Any excess metal and the negative photoresist ring 15 can then be removed using a CMP process. Thereafter, the wafer 5 is cut down along the edge 10 to resize the wafer. As should be understood by those of skill in the art, in this way, no metal wiring is formed on the edge 10, hence eliminating any contamination. FIG. 3 is representative of these processes.

Figure 4:
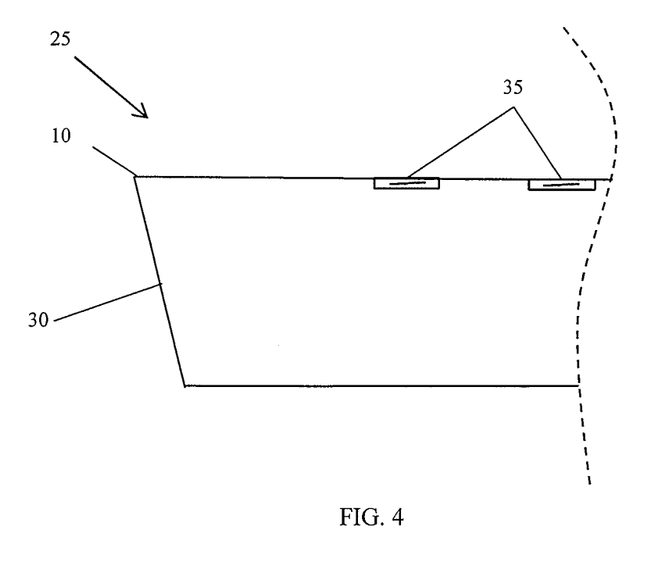
FIG. 4 shows a beveled edge of a resized wafer according to aspects of the present invention.

FIG. 4 shows an enlarged cross section of a resized wafer 25 with a beveled edge according to aspects of the present invention. In embodiments, the beveled edge 30 is formed when the larger wafer 5 is resized to form the resized wafer 25, as defined by the edge 10. In embodiments, the negative photoresist ring is wide enough to accommodate an angle of the beveled edge 30. More specifically, the width of the negative photoresist ring is tolerance based and dependent on the angle of the beveled edge 30. For example, the resized wafer 25 can be beveled at an angle of about 18 degrees, with the negative photoresist ring having a width of about 4 mm; although it should be understood by those having ordinary skill in the art that other dimensions are also contemplated by the present invention. In embodiments, the beveled edge 30 can be formed by a mechanical polishing step.

As shown in FIG. 4, the edge of the resized wafer 25 is devoid of any metal layers. Instead, the metal wiring 35 is only provided in an interior portion of the wafer 25. Also, in embodiments, the edge 10 of the resized wafer 25 is devoid of troughs in which metal layers can be formed therein. This is due to the photoresist ring blocking and/or preventing the formation of such structures at the edge 10.

Figure 5:
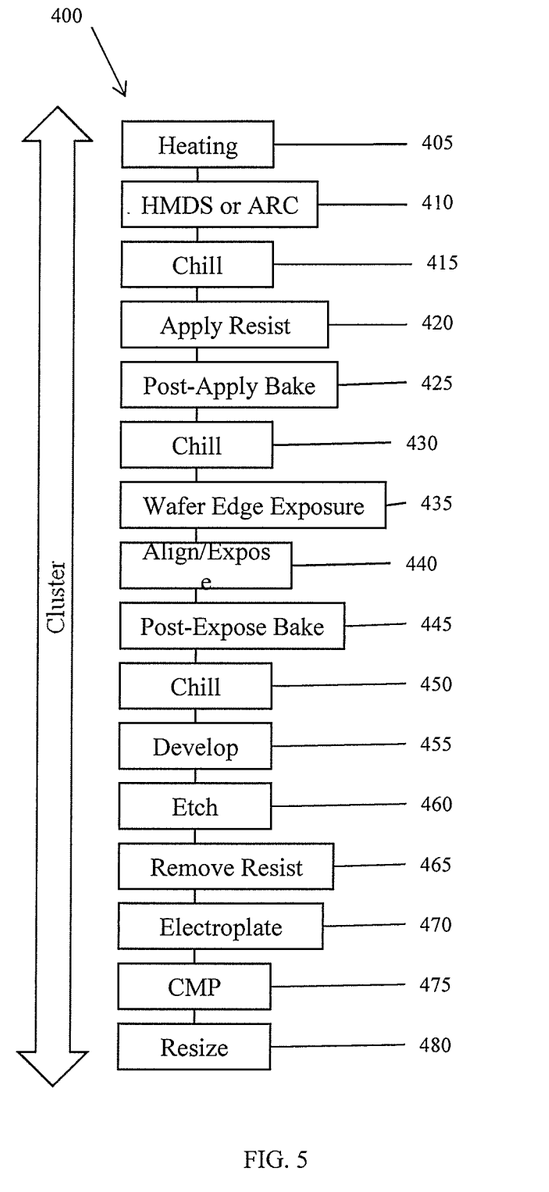
FIG. 5 shows a process flow for forming a resized wafer with a negative photoresist ring according to aspects of the present invention.

FIG. 5 shows a process flow of forming the resized wafer with the negative photoresist ring according to aspects of the present invention. It should be understood by one of ordinary skill in the art that steps of the process are linked together in a single process flow. At step 405, the process 400 includes heating the originally sized wafer to a temperature sufficient to drive off any moisture. Subsequently, at step 410, an adhesion promoter, such as hexamethyldisilazane (HMDS), is applied to promote adhesion of the photoresist to the wafer. The wafer reacts with HMDS to form a highly water repellent layer, such as tri-methylated silicon-dioxide, which prevents an aqueous developer from penetrating between the photoresist and a surface of the wafer, thus preventing lifting of small photoresist structures in the pattern. In alternate embodiments, an anti-reflective coating is applied to the wafer at step 410. At step 415, the wafer is chilled to return the wafer to a temperature for further processing.

The process 400 further includes applying a negative photoresist ring at step 420. The negative photoresist ring can be applied by spin coating as is known by those of skill in the art. At step 425, the wafer undergoes a post-apply bake to drive off excess photoresist solvent. After the post-apply bake, the photoresist-coated wafer is then chilled at step 430.

At step 435, the wafer undergoes a wafer edge exposure process, as described herein. More specifically, at step 440, the wafer is aligned with an exposure tool, which exposes the negative photoresist to a pattern of intense light or energy. The exposure to the light causes the negative photoresist to become polymerized and difficult to dissolve. A post-exposure bake process and a chill process are performed at steps 445 and 450, respectively, before the wafer is developed at step 455. As should be understood by those of skill in the art, the developing includes forming a photoresist on the wafer and exposing the photoresist to form a pattern. The process 400 further includes etching the wafer at step 460 to form troughs, using any conventional etching technique. In embodiments, dry etching techniques are used to avoid significant undercutting of the photoresist pattern. At step 465, the photoresist is removed from the substrate using a liquid photoresist stripper.

The wafer is then electroplated with Cu to form a wiring layer at step 470. At step 475 any excess Cu is removed from the edge of the wafer, i.e., along the negative photoresist ring, using a CMP process, as an example. Finally, the wafer can then be resized at step 480. The resized wafer will be devoid of metal at an edge thereof.

Figure 6:
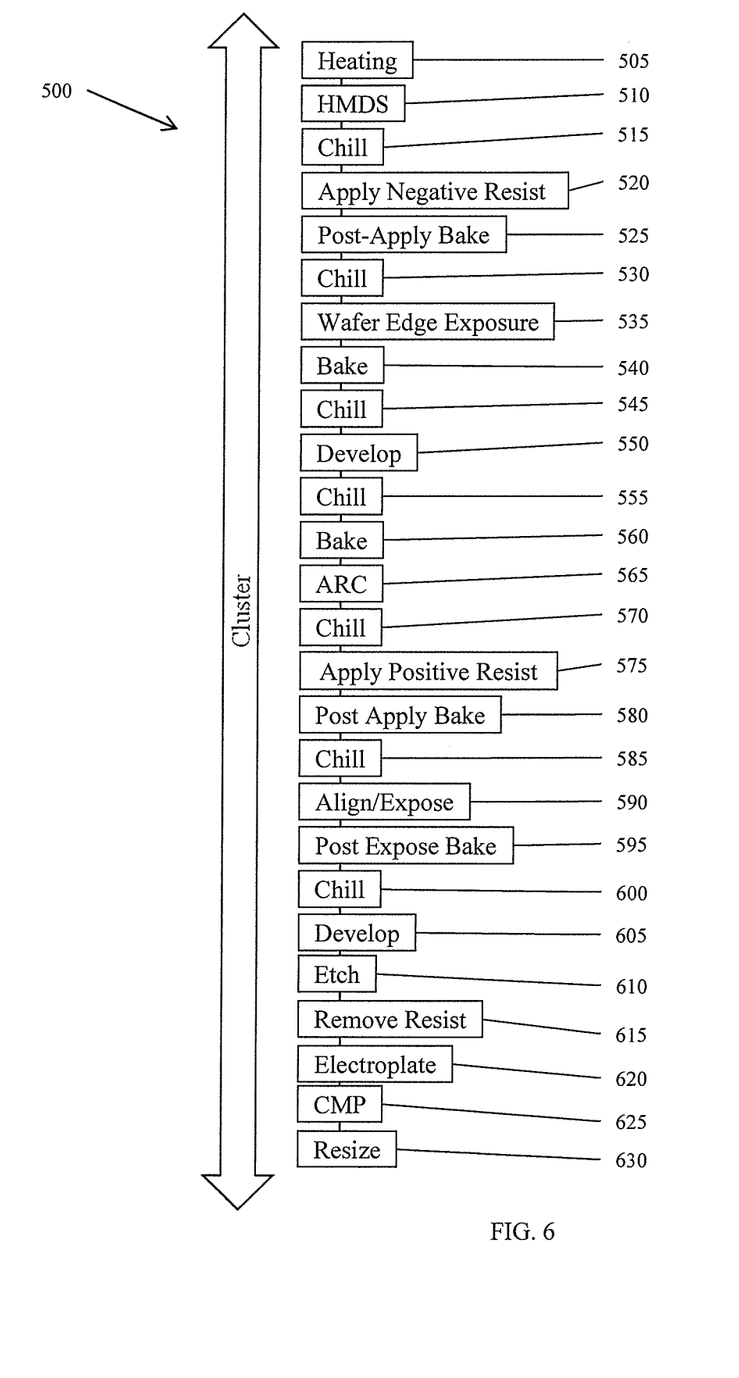
FIG. 6 shows an alternate process flow for forming a resized wafer with a negative photoresist ring according to aspects of the present invention.

FIG. 6 shows an alternate process flow of forming a resized wafer with the negative photoresist ring according to aspects of the present invention. In particular, the alternate process 500 utilizes a negative photoresist to form the negative photoresist ring and a positive photoresist to develop the pattern. At step 505, the process 500 includes heating the originally sized wafer to a temperature sufficient to drive off any moisture present on the wafer. At step 510, an adhesion promoter, such as hexamethyldisilazane (HMDS), is applied to promote adhesion of the photoresist to the wafer, as noted above. At step 515, the wafer is chilled to return the wafer to a temperature for further processing.

The process 500 further includes applying a negative photoresist ring at step 520. The negative photoresist ring can be applied by spin coating as is known by those of skill in the art. The photoresist-coated wafer undergoes a post-apply bake to drive off excess photoresist solvent, at step 525. After the post-apply bake, the photoresist-coated wafer is then chilled, at step 530, and undergoes a wafer edge exposure process at step 535, as described herein. The wafer with the exposed negative photoresist ring then is baked, chilled, developed, chilled again, and further baked in steps 540-560 as should be understood by those of ordinary skill in the art.

FIG. 6 further shows the process 500 includes applying an anti-reflective coating (ARC) to the wafer at step 565. Subsequently, at step 570, the wafer is chilled, and, at step 575, a positive photoresist layer is applied to the wafer. The wafer undergoes a post-apply bake at step 580 and is then chilled at step 585. The wafer is aligned and the positive photoresist is exposed to a pattern of intense light or energy, at step 590. For positive resists, the photoresist is exposed to light wherever the underlying material is to be removed, i.e., the positive photoresist is a subtractive material.

In FIG. 6, a post-exposure bake and chill process are performed at steps 595 and 600, respectively, before the wafer is developed at step 605. As should be understood by those of skill in the art, the developing includes forming a photoresist on the wafer and exposing the photoresist to form a pattern. The process 500 further includes etching the wafer at step 610 to form troughs, using any conventional etching technique. In embodiments, dry etching techniques are used to avoid significant undercutting of the photoresist pattern. At step 615, the photoresist is removed from the substrate using a liquid photoresist stripper.

The wafer is then electroplated with metal, e.g., Cu, to form a wiring layer at step 620. At step 625 the process 500 includes removing any excess Cu from the edge 10 of the 150 mm wafer, i.e., along the negative photoresist ring, using a CMP processes, as an example. Finally, at step 630, the wafer can then be resized. The resized wafer will be devoid of metal at an edge thereof.

Figure 7:
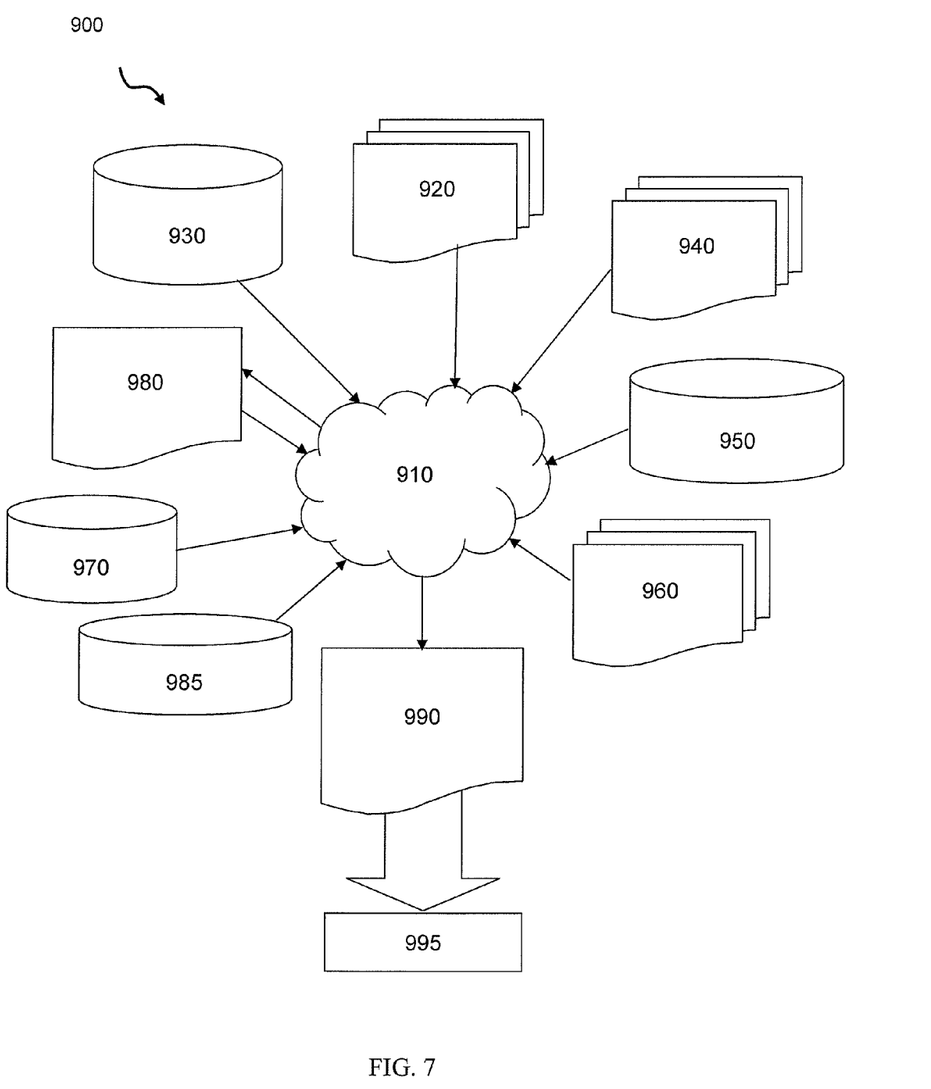
FIG. 7 is a flow diagram of a design process used in semiconductor design, manufacture, and/or test.

FIG. 7 is a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 990 may comprise a compiled, executable HDL simulation model that functionally simulates the devices shown in FIGS. 1-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a ring within a radius of a wafer;
   patterning a photoresist formed on the wafer, by exposing the photoresist to energy;
   forming troughs in a substrate of the wafer based on the patterning of the photoresist, wherein the ring blocks formation of the troughs underneath the ring;
   filling the troughs with a metal; and
   resizing the wafer at an area of the ring.

2. The method of claim 1, wherein forming the ring comprises:
   printing a negative photoresist on the wafer; and
   exposing the negative photoresist to energy with a wafer edge exposure tool.

3. The method of claim 2, wherein the ring is formed prior to filling the troughs with the metal.

4. The method of claim 3, wherein the exposed negative photoresist seals an edge of a resized wafer.

5. The method of claim 1, wherein the resizing comprises:
   cutting the wafer with a laser; and
   forming a beveled edge on a resized wafer.

6. The method of claim 5, wherein the ring has a width wide enough to accommodate an angle of the beveled edge.

7. The method of claim 5, wherein the beveled edge is sealed by the ring.

8. The method of claim 1, further comprising removing the ring and excess metal formed on the ring using a CMP process.

9. The method of claim 8, wherein an edge of a resized wafer is devoid of metal.

10. The method of claim 1, wherein the ring is formed with a negative photoresist and the pattern for the troughs is formed with a positive photoresist.

11. The method of claim 1, wherein the ring and the pattern for the troughs are formed with a negative photoresist.

12. A method comprising:
   forming a negative photoresist ring within a radius of a wafer;
   patterning a photoresist formed on the wafer, by exposing the photoresist to energy;
   forming troughs in a substrate of the wafer based on the patterning of the photoresist, wherein the negative photoresist ring blocks formation of the troughs underneath the negative photoresist ring;
   filling the troughs with a metal;
   removing the negative photoresist ring and excess metal using a CMP process; and
   resizing the wafer at an area of the negative photoresist ring.

13. The method of claim 12, wherein forming the negative photoresist ring comprises:
   printing the negative photoresist on the wafer;
   exposing the negative photoresist with a wafer edge exposure tool; and
   the negative photoresist ring is formed prior to filling the troughs with metal.

14. The method of claim 13, wherein resizing the wafer comprises:
   cutting the wafer with a laser; and
   forming a beveled edge on a resized wafer.

15. The method of claim 14, wherein the negative photoresist ring has a width wide enough to accommodate an angle of the beveled edge.

16. The method of claim 13, wherein the exposed negative photoresist seals an edge of a resized wafer.

17. The method of claim 16, wherein the edge of the resized wafer is devoid of metal.

* * * * *